United States Patent [19]

Yamakoshi et al.

[11] Patent Number: 4,804,927

[45] Date of Patent: Feb. 14, 1989

[54] CURRENT AMPLIFIER CIRCUIT

[75] Inventors: Akira Yamakoshi; Toyohiko Fujita; Kunihiko Tsukakoshi; Shinji Anraku, all of Tokyo, Japan

[73] Assignee: Seikosha Co., Ltd., Tokyo, Japan

[21] Appl. No.: 91,608

[22] Filed: Aug. 31, 1987

[30] Foreign Application Priority Data

Sep. 2, 1986 [JP] Japan ................................. 61-206524

[51] Int. Cl.$^4$ .............................................. H03F 3/04
[52] U.S. Cl. .................................... 330/288; 323/315
[58] Field of Search ............... 330/257, 288; 323/315, 323/316

[56] References Cited

U.S. PATENT DOCUMENTS

| | | | |
|---|---|---|---|
| 3,364,434 | 1/1968 | Widlar | 330/257 |
| 3,835,410 | 9/1974 | Wittlinger | 323/315 X |
| 3,992,676 | 11/1976 | Knight | 330/288 |
| 4,461,989 | 7/1984 | Dotson et al. | 330/257 X |

Primary Examiner—James B. Mullins
Attorney, Agent, or Firm—Bruce L. Adams; Van C. Wilks

[57] ABSTRACT

A current amplifier circuit has a first transistor with a collector and a base which are electrically connected, a second transistor connected in series with the first transistor and having a collector and a base which are electrically connected. A third and fourth transistor are connected in series with the collector of the first transistor connected to a base of the third transistor and the collector of the second transistor connected to a base of the fourth transistor through a resistor having a resistance R. The first, second, third and fourth transistors have the same polarity. An amplified output signal current $R \cdot i / R_E$ is obtained from a collector of the third transistor, wherein $R_E$ is the emitter resistance of the fourth transistor and i is the input signal applied to the base of the fourth transistor.

6 Claims, 1 Drawing Sheet

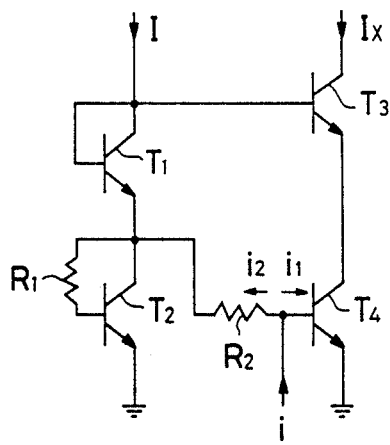
FIG. 1
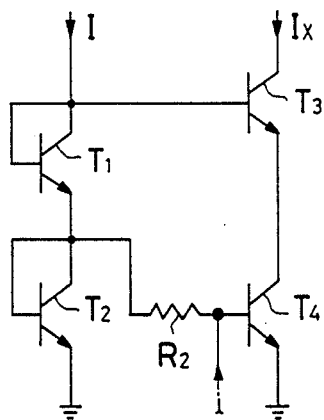
FIG. 2
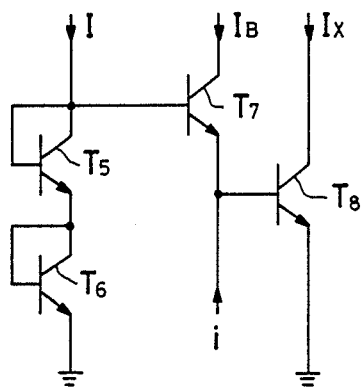
PRIOR ART FIG. 3

CURRENT AMPLIFIER CIRCUIT

FIELD OF THE INVENTION

The present invention relates to a curent amplifier circuit.

BACKGROUND OF THE INVENTION

A current amplifier circuit shown in FIG. 3 has been used for a detecting circuit and operations of this circuit are explained hereunder. When a bias current flowing into the transistors $T_5$, $T_6$ is I, a base potential $V_b$ of the transistor $T_7$ at the normal temperature is expressed as follows.

$$V_b = 2 \cdot (KT/q \cdot \ln I/IS)$$

Where, K is Boltzmann's constant, T is absolute temperature, q is charge. When $T = 300°$ K., $KT/q$ becomes $26 \times 10^{-3}$ $$V_b = 2(26 \times 10^{-3} \cdot \ln I/IS)$$

It is equal to a sum of the base and emitter voltages of transistors $T_7$, $T_8$. Therefore, $$2(26 \times 10^{-3} \ln I/IS) = 26 \times 10^{-3}(\ln IB/IS + \ln IX/IS)$$

This equation can be transformed as follow.

$$2\ln(I/IS) = \ln(IBIX/IS^2) \therefore I^2 = IB \cdot IX$$

Here, if $IB = IX/h_{FE}$, $$I^2 = IX^2/h_{FE}$$

Therefore, following relation can be obtained.

$$IX = I\sqrt{h_{FE}}$$

Namely, a bias current IX of transistor $T_8$ becomes equal to $\sqrt{h_{FE}}$ times of the bias current I.

Meanwhile, when an input current is i, current gain becomes almost $h_{FE}$ times.

In above structure, since bias current IX and current gain of output transistor $T_8$ much depends on $h_{FE}$, such structure has been weak with regard to fluctuation of elements and it has also been difficult to design such structure. It has also been a factor to realize integration of this structure.

SUMMARY OF THE INVENTION

It is therefore an object of the present invention to provide a current amplifier circuit which is easy to be designed, resistive to influence of fluctuation of elements and is just suited to integration.

BRIEF DESCRIPTION OF THE DRAWINGS

FIG. 1 is an electric circuit indicating an embodiment of the present invention, FIG. 2 is an electric circuit indicating another embodiment of the present invention, and FIG. 3 is an electric circuit indicating the prior art.

DETAILED DESCRIPTION OF THE INVENTION

In FIG. 1, the diode-connected first transistor $T_1$ is connected in series to the second transistor $T_2$ and the collector and base thereof are connected through a resistor $R_1$ and the collector of transistor $T_1$ is connected to the base of transistor $T_3$, while the collector of transistor $T_2$ is connected to the base of transistor $T_4$ through a resistor $R_2$. An input current is applied to the base of transistor $T_4$ and it is amplified as the output current of transistor $T_3$.

In above structure, when a bias current flowing into the transistors $T_1$, $T_2$ is I and a bias current flowing into the transistors $T_3$, $T_4$ is IX, a collector voltage $Vb_2$ of transistor $T_2$ is expressed as follow.

$$26 \times 10^{-3} \cdot \ln I/IS + R_1 I/h_{FE}$$

Since it is equal to a sum of voltage across the resistor $R_2$ and the base-emitter voltage of transistor $T_4$, $$26 \times 10^{-3} \cdot \ln I/IS + R_1 I/h_{FE} =$$
$$26 \times 10^{-3} \cdot \ln IX/IS + R_1 IX/h_{FE}$$

This equation can be transformed as follows.

$$I/IX = \text{EXP } R(IX-1)/h_{FE} 26 \times 10^{-3}$$

This equation stands when $I = IX$. Thereby, it can be understood that a bias current I becomes equal to IX.

Next, a current gain by this circuit will then be explained. When an input current is i, a current flowing into the base side of transistor $T_4$ is $i_1$ and a current flowing into the resistor $R_2$ side is $i_2$, $$i = i_1 + i_2$$

When a signal current flowing into the transistor $T_4$ is iS, $$iS = h_{FE} i_1$$

Variation of base voltage of transistor $T_4$ is expressed as follows when an emitter resistance of transistor $T_4$ is $R_E$, $$R_E iS = R_E h_{FE} i_1.$$

As a result, current flowing into the resistor $R_2$ side is expressed as follows.

$$i_2 = R_E iS/R = R_E h_{FE} i/R.$$

Here, a current gain of transistor $T_4$ is expressed as follows.

$$\begin{aligned} iS/i &= i_1 h_{FE}/i \\ &= i_1 h_{FE}/i_1 + R_E i_1 h_{FE}/R \\ &= R/(R/h_{FE} + R_E) \end{aligned}$$

When $h_{FE}$ is large, it becomes almost equal to $R/R_E$ and the gain can be determined without relation to $h_{FE}$.

According to such a circuit structure, a bias current and a current gain do not depend on $h_{FE}$ of transistor. Therefore, these are not influenced by fluctuation of circuit elements. In addition, such structure assures easy circuit design and application to integration.

FIG. 2 indicates an example of a structure where a resistor $R_1$ in FIG. 1 is eliminted. Even in such a structure, the same current gain as the previous embodiment can be obtained. Here, the relation between bias currents I and IX is as follows.

$$I/IX = EXP\{(RIX/h_{FE})/26 \times 10^{-3}\}$$

When $R_2$ is zero, I becomes equal to IX.

In the above embodiment, an NPN transistor is used but the similar circuit can also be structured by utilizing a PNP transistor.

The present invention realizes an easy design of circuit structure which ensures less dependency on $h_{FE}$ of the bias current and current gain, less influence of fluctuation of the elements and easy circuit design, thereby resulting in the advantage of easy integration of circuit.

What is claimed is:

1. A current amplifier circuit comprising: a first transistor having a collector and a base which are electrically connected, a second transistor connected in series with the first transistor and having a collector and a base which are electrically connected, a third and a fourth transistor connected in series, wherein the collector of the first transistor is connected to a base of the third transistor and the collector of the second transistor is connected to a base of the fourth transistor through a resistor having a resistance R, wherein the first, second, third and fourth transistors have the same polarity, wherein an amplified output signal current $R \cdot i/R_E$ is obtained from a collector of the third transistor when an input signal current i is applied to the base of the fourth transistor, and wherein $R_E$ is emitter resistance of the fourth transistor.

2. A current amplifier circuit according to claim 1, wherein the collector and the base of the second transistor are connected through a resistor.

3. A current amplifier circuit according to claim 1, wherein the collector and the base of the second transistor are directly connected.

4. A current amplifier circuit comprising:
 a first transistor having a base and a collector connected together and receptive of a bias current, and an emitter;
 a second transistor having a base and a collector electrically connected;
 a third transistor having a base connected to the collector of the first transistor, an emitter and a collector at which an amplified output signal is obtained; and
 a fourth transistor having a collector connected to the emitter of the third transistor and a base connected to the collector of the second transistor through a resistor and receptive of an input current to be amplified;
 wherein the first, second, third and fourth transistors have the same polarity.

5. The circuit according to claim 4, wherein the base and collector of the second transistor are directly connected.

6. The circuit according to claim 4, wherein the base and collector of the second transistor are connected through a resistor.

* * * * *